United States Patent

[11] 3,584,264

[72] Inventors Raymond M. McLouski
Glen Burnie;
James R. Cricchi, Catonsville, both of, Md.

[21] Appl. No. 715,050
[22] Filed Mar. 21, 1968
[45] Patented June 8, 1971

[73] Assignee Westinghouse Electric Corporation
Pittsburgh, Pa.

[54] ENCAPSULATED MICROCIRCUIT DEVICE
1 Claim, 3 Drawing Figs.

[52] U.S. Cl. .......... 317/234, 317/235, 29/589, 29/590, 29/591
[51] Int. Cl. .......... H01l 1/14
[50] Field of Search .......... 317/234, 235, 3, 3.1, 5, 5.4, 22, 46; 29/589, 590, 591

[56] References Cited

UNITED STATES PATENTS

| | | | |
|---|---|---|---|
| 3,465,209 | 9/1969 | Denning et al. | 317/234 |
| 3,247,428 | 4/1966 | Perri et al. | 317/234 |
| 3,303,399 | 2/1967 | Hoogendoorn et al. | 317/234 |
| 3,392,312 | 7/1968 | Carman | 317/234 |
| 3,419,765 | 12/1968 | Clark et al. | 317/234 |

*Primary Examiner*—John W. Huckert
*Assistant Examiner*—Polissack R. F.
*Attorneys*—F. Shapoe and Lee P. Johns

ABSTRACT: An encapsulated microcircuit device including a wafer of semiconductor material, an intermediate coating of silicon dioxide on the wafer, a metal interconnect pattern on the silicon dioxide coating and having portions extending therethrough to the wafer, an outer coating on the intermediate coating and on the metal interconnect pattern and being composed of glass and a metal oxide and having a coefficient of thermal expansion substantially equal to that of the interconnect pattern and the silicon dioxide coating.

PATENTED JUN 8 1971

3,584,264

WITNESSES
Theodore F. Wrobel
Lee P. Johns

INVENTORS
Raymond M. Mc Louski
and James R. Cricchi
BY
C. L. Menzemer
ATTORNEY

ENCAPSULATED MICROCIRCUIT DEVICE

BACKGROUND OF THE INVENTION

1. Field of the Invention

This invention relates to the semiconductor art and more particularly it pertains to a glass modified to contain a metal oxide which coating has a coefficient of thermal expansion comparable to a metal interconnect pattern on the surface of the semiconductor wafer.

2. Description of the Prior Art

Integrated circuits in use today are hermetically sealed in two fundamental package shapes. These are either a modification of the traditional transistor header or the rectangular flat package. Single and multiple circuit functions occur in each individual package enclosure. However, for either of the above hermetically sealed packages, it is not possible to effectively utilize the entire internal volume. If this type of individual chip enclosure were eliminated, a considerable savings in the packaging volume could be realized since the large unused void that exists inside the package would be eliminated. In order to satisfy the foregoing some means had to be found to protect the metal interconnect and the silicon dioxide layer which covers the active surface of the typical integrated surface. Various methods used included encapsulation in plastic and in low melting point glasses such as arsenic-sulfur glass as well as the somewhat higher temperature borosilicate glasses.

Due to its unreliability under extreme environmental conditions encapsulation of integrated circuits in plastic has met with the least success. The use of glass coatings as outer packaging envelopes for microcircuits offers the best means for elimination of modified transistor and "flat-pack" type of packaging presently used for the packaging of microcircuits. The glass layer can be applied before and after the metal semiconductor contacts are made, depending upon the device geometry as well as on other device considerations.

The selection of glass for the protective layer involves the consideration of several factors including thermal expansion coefficient, electrical properties, chemical stability, impurities, and firing temperature. To avoid crazing due to thermal stresses, the thermal coefficients of the silicon, silicon dioxide, the metal contacts, and the glass layer should be substantially comparable. In addition, the value of the ionic mobility versus time of impurities present in the glass must also be low.

With regard to electrically active impurities in concentration levels comparable to impurity levels in the semiconductor there is no serious problem of the impurities being released from the glass and into the intermediate layer of silicon dioxide unless the firing of the glass occurs above approximately 800°C.

It has been found in accordance with this invention that the foregoing problems may be overcome by the encapsulation of a microcircuit in a glass having a high melting point and which glass is modified by the addition of an oxide of suitable metal of which predetermined amounts are added to provide a thermal expansion coefficient corresponding to that of the metal interconnect pattern and the silicon dioxide layer.

Accordingly, it is the general object of this invention to provide an encapsulated microcircuit device having a protective glass coating the thermal expansion coefficient of which corresponds to the other components of the microcircuit.

It is another object of this invention to provide a microcircuit device having a protective outer coating which is resistant to adverse environmental conditions such as humidity, thermal, and mechanical shock.

Finally, it is an object of this invention to satisfy the foregoing objects and desiderata in a simple and expedient manner.

SUMMARY OF THE INVENTION

The encapsulated microcircuit device of the present invention comprises a wafer of semiconductor material, an intermediate coating of silicon dioxide on the wafer, a metal interconnect pattern on the silicon dioxide coating and having portions extending therethrough to the wafer, an outer coating on the intermediate coating and on the metal interconnect pattern and being composed of glass and a metal oxide and having a coefficient of thermal expansion substantially equal to that of the interconnect pattern and of the silicon dioxide coating.

In the method in accordance with this invention, the glass layer is formed by the thermal decomposition of vaporized compound which has silicon dioxide, such as tetraethylorthosilicate, simultaneously with the thermal decomposition of a gaseous metal hydride to produce a metal oxide in the glass to modify its thermal expansion coefficient. The metal hydride may be at least one member selected from the group consisting of borane, diborane, arsine, and phosphine.

BRIEF DESCRIPTION OF THE DRAWINGS

For a better understanding of the nature and objects of this invention, reference is made to the drawings, in which.

Similar numerals refer to similar parts throughout the several views of the drawings.

DESCRIPTION OF THE PREFERRED EMBODIMENTS

Figure 1:
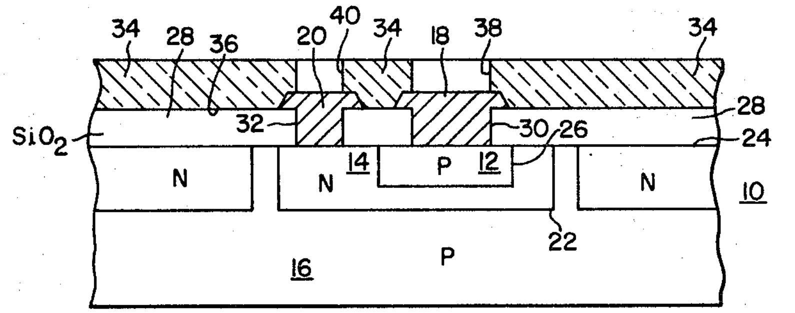
FIG. 1 is a sectional view of one embodiment of the present invention.

The sectional view of FIG. 1 illustrates a portion of a microcircuit structure intended to be integrated in a unitary structure. A wafer or transistor amplifier generally indicated at 10 includes an emitter region 12, a base region 14, and a collector region 16. The regions 12 and 14 are provided with metal contacts 18 and 20, respectively.

The regions 12 and 16 are composed of a P-type conductivity material and the base region 14 is composed of an N-type conductivity material. The regions 14 and 16 are zones of opposite polarity and are separated by a PN junction 22. The region 12 is disposed in the region 14 at a surface 24 remote from the junction 22 and is separated from the region 14 by a PN junction 26.

As shown in FIG. 1 a layer 28 of silicon dioxide ($SiO_2$) is applied to the surface 24 of the water 10. The layer 28 has a thickness ranging from about 1000 A. to 20,000 A. As shown, the contacts 18 and 20 extend through holes 30 and 32 in the layer 28 in order to engage the emitter region 12 and the base region 14 respectively.

An outer coating or film 34 is applied to the outer surface 36 of the layer 28. The film 34 has a thickness ranging from about 1000 to 10,000 Angstroms. Openings 38 and 40 are provided in the film 34 in order to have access to the metal contacts 18 and 20 respectively.

Figure 2:
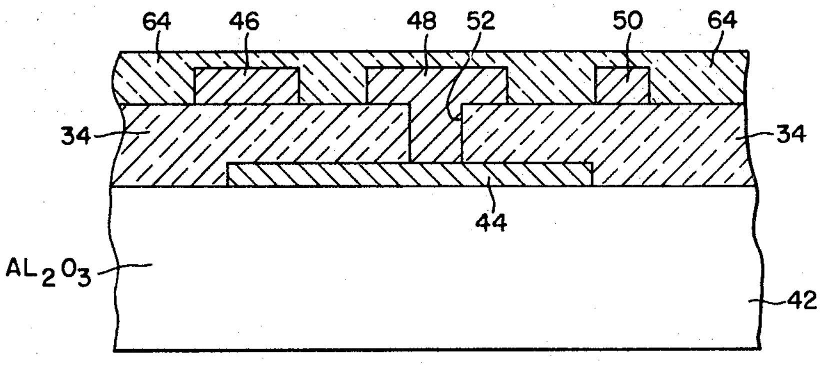
FIG. 2 is a sectional view of another embodiment of the invention.

Another embodiment of the invention is shown in FIG. 2 in which a layer 42 is disposed beneath the film 34 of glass. The layer 42 is composed of a glazed ceramic material, such as alumina ($Al_2O_3$), either as a substitute for or in addition to the layer 28 of silicon dioxide (FIG. 1), for which latter purpose it is disposed between the layer 28 and the glass film 34. For either purpose a first level conductor 44 may be provided on the upper surface of the layer 42. In addition, second level conductors including conductors 46, 48, and 50 are provided on the outer surface of the film 34 for any suitable purpose such as connection with a first level conductor as s own by the lower portion of the conductor 48 extending through a hole 52 into contact with the first level conductor 44.

In order to maintain the initial electrical parameters of the wafer 10 as long as possible even in such adverse environments as humidity, thermal, and mechanical shock, the film 34 of glass is composed of ingredients that provide it with a coefficient of thermal expansion comparable to that of the adjacent parts including the layer 28 and the metal contacts 18 and 20 as well as the metal members 44, 46, 48 and 50 (FIG. 2). Thus, the film 34 is stable both chemically and physically.

The film 34 is applied by the deposition of a smooth continuous silica film on the substrate which is either the wafer 10 or the layer 28 of silica. Ordinarily, where the wafer 10 is devoid of metal interconnecting members a layer or film of silica over the wafer would suffice. Thus, for example, the layer 28 may be applied by the complete thermal decomposition of tetraethylorthosilicate in an oxidizing atmosphere according to the following formula:

$$Si(OC_2H_5)_4+12O_2 \rightarrow SiO_2+10\ H_2O+8\ CO_2$$

This reaction occurs at temperatures greater than approximately 350° C. and is the basis for the chemical deposition of pure silica films on semiconductor substrates within the temperature range of about 500° to about 900° C.

Where the semiconductor substrate is provided with a metal interconnect pattern on the surface thereof, a pure silica glass deposited in accordance with the above formula over the area of the metal interconnect cracks when subjected to temperature variations occurring during operation of the device because of the difference in the coefficient of thermal expansion between the glass film, the metal interconnect pattern, and the semiconductor surface. For that reason the silica glass is preferably doped with a metal oxide in order to adjust the coefficient of thermal expansion which is directly dependent upon the amount of metal oxide incorporated with the silica dioxide. The metal oxides include elements selected from the group consisting of boron, arsenic, and phosphorus which are added as metal hydrides, such as $B_2H_6$, $AsH_3$, $PH_3$, and mixtures thereof, which thermally decompose and react with the tetraethylorthosilicate to form the metal oxide modified silica glass film 34.

The method of deposition generally is as follows: The glass to be used as the film for coating the semiconductor is ground to a particle size of approximately 0.1 micron. The ground particles are then mixed with an organic solvent or binder to form a suspension which is then applied to the outer surface 36 of the silica layer 28. The suspension intact on the wafer is then compacted by centrifuge after which it is heated to the softening temperature of the glass for a varying period of time. This is essentially a sintering operation whereby the glass does not flow appreciably. Thereafter the wafer is photoengraved, metallized, scribed, and diced in accordance with standard procedures.

Figure 3:
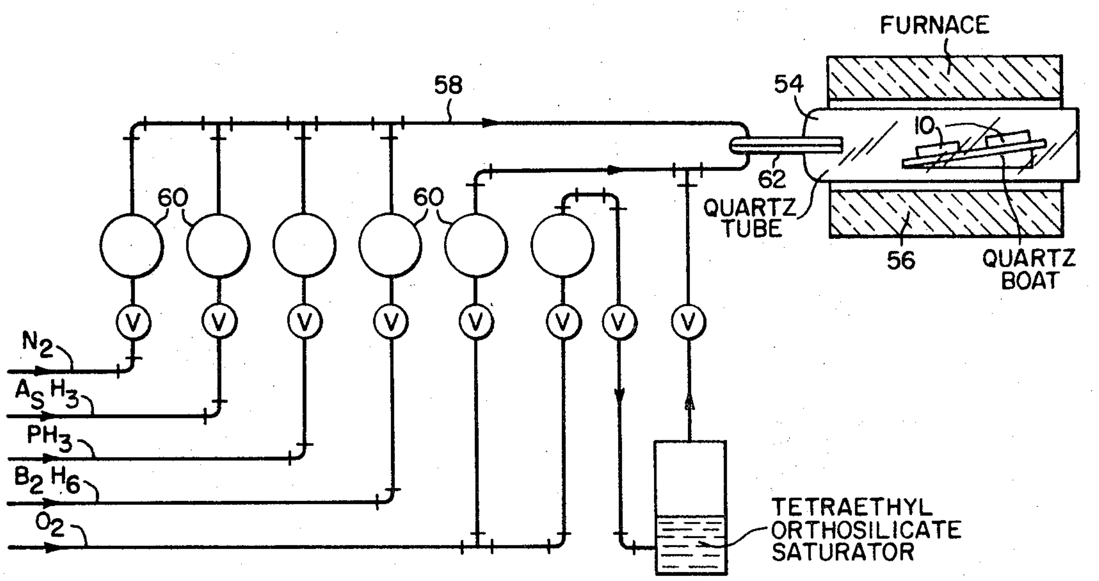
FIG. 3 is a flow diagram of a system for applying a dielectric coating of glass on microcircuit devices such as those included in FIGS. 1 and 2.

The film 34 is preferably applied by thermal deposition by the use of apparatus such as that shown in FIG. 3. As shown two or more wafers 10 having layers 28 of silicon dioxide are placed in a quartz deposition tube 54 which is disposed within a furnace 56, a plurality of sources of gases including nitrogen ($N_2$), arsenic hydride ($AsH_3$), phosphorus hydride ($PH_3$), boron hydride ($B_2H_6$), and oxygen, as well as tetraethylorthosilicate are connected by conduits generally indicated at 58 which include a plurality of flow meters 60 to the tube 54 via a feed tube 62, whereby the glass films 34 are deposited on the semiconductor substrates by simultaneous decomposition of the tetraethylorthosilicate and the gaseous metallic hydrides including arsenic hydride, phosphorus hydride, and boron hydride.

The following example illustrates the practice of the invention:

The wafer 10, which is to be coated, is placed in a furnace 56 maintained at a temperature above 500° C. and allowed to come to equilibrium in a atmosphere of oxygen and nitrogen. When the substrates have reached the deposition temperature, the flow of oxygen is metered through the source of tetraethylorthosilicate. Arsenic hydride ($AsH_3$) is then flowed through the meter 60 and deposited upon the substrate surface where the arsenic hydride is converted to arsenic oxide ($As_2O_3$) to form a modified silica glass the thickness of which is determined by the temperature and time of application. Thereafter, the flow of arsenic hydride and oxygen is terminated and the substrate is removed from the furnace.

The flow rate of the several gases involved in forming doped glass film is shown in the accompanying table:

TABLE.—FLOW RATE OF GASES FORMING DOPED GLASS FILM

| | Flow rate in liters/minute |
|---|---|
| Nitrogen | 1 |
| 1% $AsH_3$ in $N_2$ | 0. 13 |
| Oxygen | 4 |
| $O_2$ in $Si(OC_2H_5)_4$ | 2 |

At a temperature of 500° C. a glass film thickness of 4000 A. was produced after 60 minutes of flow. Likewise, the glass film thickness of 6000 A. was produced after 90 minutes of flow.

Identical film thicknesses of boron oxide modified glass film and of phosphorus oxide modified film were deposited for the above set of conditions except that the flow of $B_2H_6$ was 0.05 liter per minute of 1 percent $B_2H_6$ in nitrogen, and the flow of $PH_3$ was 0.13 liter per minute of 1 percent $PH_3$ in nitrogen. The dielectric strength of all the above glass films was measured and found to be approximately 10 volts per 100 A. as compared to the published values of 10 volts per 100 A. of thermally grown silicon dioxide. Both silicon dioxide and glazed alumina ($Al_2O_3$) substrates were used with evaporated metal interconnections of aluminum and chromium-gold alloy. The glazed ceramic substrates were of the type normally used in the fabrication of microminiature printed circuits or high density packaging techniques for microcircuits. The structures set forth in the example were then thermally cycled between −50° C. and 200° C. No cracks or crazing of the protective glass layer occurred. Moreover, a final glass protective film 64 was applied on the film 34 (FIG. 2) by the above indicated method of deposition in order to seal the second level conductors 46, 48, and 50.

Accordingly, the procedure for the formation and deposition of thin glass films on the active surface of a semiconductor wafer having a metal interconnect pattern on the surface may be used to provide an effective hermetic seal of the device and/or a second level for the deposition of interconnects or passive thin film components. It utilizes the thermal decomposition of tetraethoxysilane for the formation of a silica glass film and the simultaneous thermal decomposition of a gaseous metallic hydride for the incorporation of a metal oxide in the film to modify the thermal expansion coefficient of the deposited glass. The glass is formed in an open flow system and deposited at several hundred degrees below the softening point of the glass.

Several advantages obtained from the process including:

1. A protective glass coating deposited directly upon the oxide-metal interconnect surface of a semiconductor substrate through a thermal decomposition technique.

2. Readily controlled thickness of the glass deposit through a temperature-time relationship.

3. Control of the thermal expansion coefficient of the glass by the amount of gaseous metal hydride metered through the thermal decomposition reaction.

4. Use of a glass layer as a dielectric in multilayer interconnect systems and as a final hermetic seal for a semiconductor device.

It is understood that the above specification and drawings are merely exemplary and not in limitation of the invention.

We claim:

1. An encapsulated microcircuit comprising a wafer of semiconductor material, a metal interconnect pattern disposed on the surface of the wafer, an alumina coating extending over the surface of the wafer and the pattern, a coating of silicon dioxide on the alumina coating, a ceramic film of silica glass on the silicon dioxide coating and containing an oxide of an element from at least one of the group consisting of boron, arsenic, and phosphorus, and a metal conductor between at least two of the alumina coating, the coating of silicon dioxide, and the ceramic film of silica glass.